(12) United States Patent
Brower et al.

(10) Patent No.: US 8,132,616 B1
(45) Date of Patent: Mar. 13, 2012

(54) TEMPERATURE CONDITIONING SYSTEM WITH THERMO-RESPONSIVE VALVES

(75) Inventors: David M. Brower, Marion, IA (US); Bradley J. Horejsi, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 240 days.

(21) Appl. No.: 12/380,219

(22) Filed: Feb. 25, 2009

(51) Int. Cl.
*F28F 27/00* (2006.01)
*F28F 27/02* (2006.01)
*H05K 7/20* (2006.01)

(52) U.S. Cl. ............ 165/288; 165/41; 165/104.31; 165/104.33; 165/80.4; 165/80.5; 165/101; 165/206; 165/294; 165/296; 165/300; 361/699

(58) Field of Classification Search ........... 165/206, 165/294, 296, 300, 101, 104.33, 80.4, 80.5, 165/41, 104.31, 288; 361/695, 696, 697, 361/699, 689
See application file for complete search history.

(56) References Cited

U.S. PATENT DOCUMENTS

| 2,942,165 | A * | 6/1960 | Jackson et al. ............... 165/80.4 |
| 3,850,234 | A * | 11/1974 | Fowler ........................... 165/153 |
| 6,991,028 | B2 * | 1/2006 | Comeaux et al. ............. 165/219 |
| 2009/0200007 | A1 * | 8/2009 | Foy et al. ....................... 165/287 |

FOREIGN PATENT DOCUMENTS

| DE | 2916748 A | * | 10/1980 |
| EP | 1229281 A2 | * | 8/2002 |
| JP | 61197996 A | * | 9/1986 |
| JP | 01269836 A | * | 10/1989 |
| JP | 07094881 A | * | 4/1995 |
| JP | 2000167014 A | * | 6/2000 |

* cited by examiner

*Primary Examiner* — John Ford
(74) *Attorney, Agent, or Firm* — Donna P. Suchy; Daniel M. Barbieri

(57) ABSTRACT

Disclosed is a temperature conditioning system including several thermal transfer blocks, where each is associated with one of several components requiring thermal management. Each of the components is associated with a different time dependent thermal management profile. A fluid path, with a heat transfer fluid, connects one or more transports to the thermal transfer blocks. For each thermal transfer block, at least one thermo-responsive valve is located downstream from the thermal transfer block. The thermo-responsive valve is passive in that it does not require energy other than thermal energy to move from a starting position to an ending position and the thermo-responsive valve is free of any exterior control lines. A method of temperature conditioning components is also disclosed including circulating a heat transfer fluid and optimizing the flow rate of the heat transfer fluid in response to differential changes in temperature of the heat transfer fluid by actuating one or more thermo-responsive valves.

18 Claims, 2 Drawing Sheets

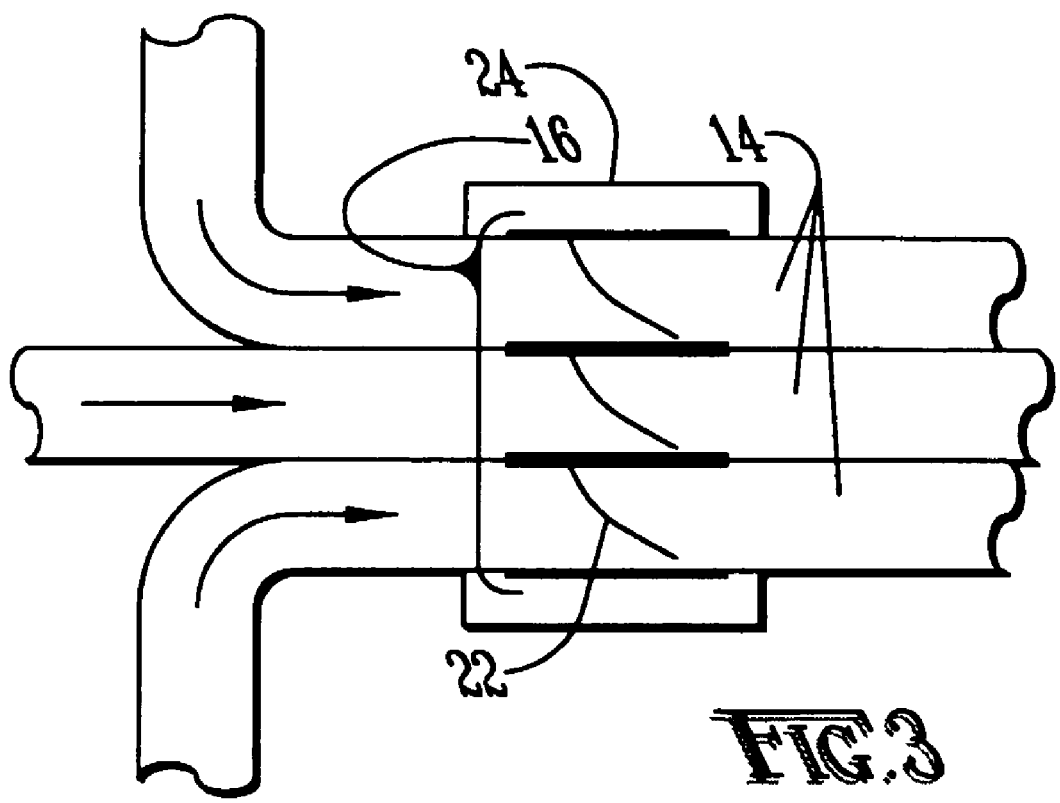

__US 8,132,616 B1__

TEMPERATURE CONDITIONING SYSTEM WITH THERMO-RESPONSIVE VALVES

FIELD OF THE INVENTION

The present invention relates to temperature conditioning systems for components requiring thermal management including thermo-responsive valves used to control the flow rate of a heat transfer fluid.

BACKGROUND OF THE INVENTION

All electrical circuitry requires temperature conditioning to function properly and to maintain longevity of the components. Failure rates for electronic devices increase with the temperature fluctuations of the circuitry. Traditionally, air blown across the circuitry has been sufficient to cool electrical circuitry. Recently, plumbed systems utilizing liquid coolants have become popular because liquid coolants are much more efficient than air in removing thermal energy from circuitry. Liquid coolant systems are most useful for devices that are densely packed and have high heat generation values. However, plumbed systems are complex in that they typically require pumps, valves, temperature sensors, tubing and coolant, all of which often require an electronic control unit to coordinate the operation of the sensors, pumps and valves to properly maintain the flow of coolant through the system. In many situations, space is at a premium, so any size or weight that can be removed from the cooling system can be dedicated to electrical circuitry or otherwise dedicated to making the overall device smaller. Furthermore, traditional systems that provide temperature management focus solely on heat removal or cooling a circuit during operation. There are instances where warming of a circuit is required.

The present invention overcomes one or more of these problems.

SUMMARY OF THE INVENTION

Disclosed is a temperature conditioning system including several thermal transfer blocks, where each is associated with one of several components requiring thermal management. Each of the components is associated with a different time dependent thermal management profile. A fluid path, with a heat transfer fluid, connects one or more transports to the thermal transfer blocks. For each thermal transfer block, at least one thermo-responsive valve is located downstream from the thermal transfer block. The thermo-responsive valve is passive in that it does not require energy other than thermal energy to move from a starting position to an ending position and the thermo-responsive valve is free of any exterior control lines. A method of temperature conditioning components is also disclosed, including circulating a heat transfer fluid and optimizing the flow rate of the heat transfer fluid in response to differential changes in temperature of the heat transfer fluid by actuating one or more thermo-responsive valves.

BRIEF DESCRIPTION OF THE DRAWINGS

In the drawings:

FIG. 3 shows a cross-section of a plurality of fluid paths that are attached to a unitary base.

DETAILED DESCRIPTION

Figure 1:
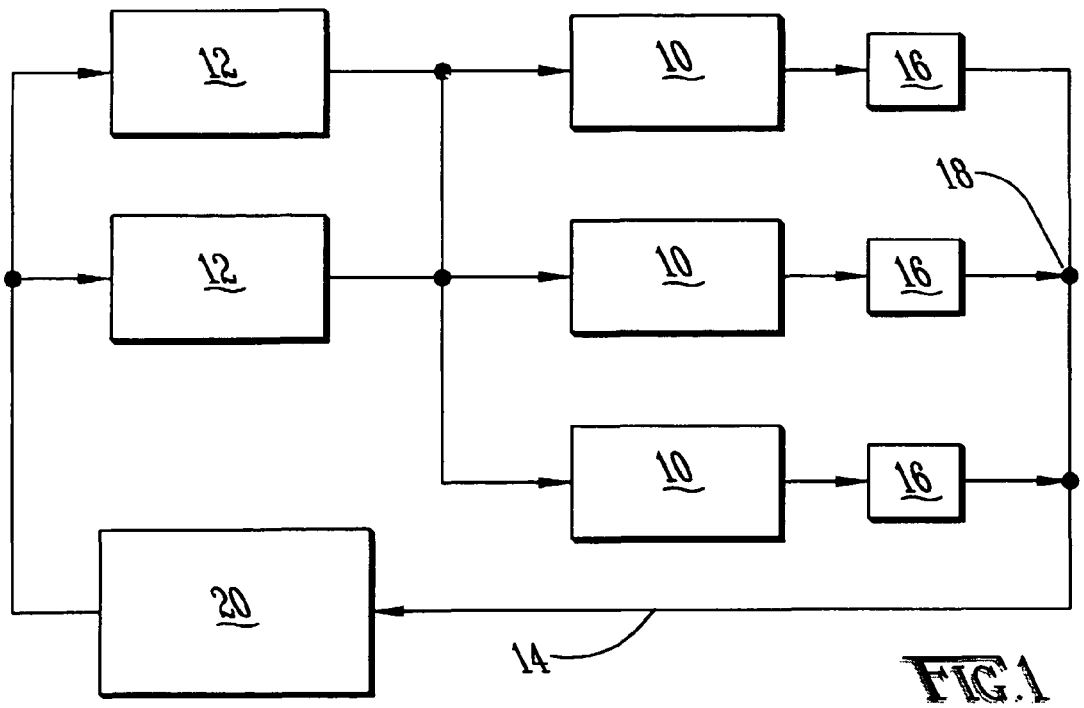
FIG. 1 shows a schematic layout of a first embodiment of a temperature conditioning system.

The invention includes a fluid temperature conditioning system for components requiring thermal management in an electronic device. As seen in FIG. 1, a plurality of thermal transfer blocks 10 are fluidly connected to one or more transports 12 by a fluid path 14. The transports circulate a heat transfer fluid through the fluid path (shown by the arrows), while each thermal transfer block is associated with a component requiring thermal management. Also associated with each thermal transfer block 10 is a valve 16 that actuates in response to changes in the temperature of the heat transfer fluid. The fluid path may be designed with one or more interconnection points 18 where portions of the fluid path are consolidated or divided to form branches of the fluid path. Optionally, the system also includes one or more heat sinks 20 not associated with the component. An important feature of the present invention can be understood by taking note of what is not included in FIG. 1. The valves 16 are electrically isolated; i.e., free of any electrical connection to a remote power source, remote sensors or a processing unit. These valves may be termed 'passive' valves in that they react to changes in ambient conditions.

Preferably, the valve is located between the thermal transfer block and the transport in the fluid path; however, the valve may be incorporated as part of the thermal transfer block per se, be co-located with the thermal transfer block or co-located with the transport. More preferably, the valve is located in a portion of the fluid path between thermal transfer block and the first down stream interconnection point. In this way, a single valve is reliably responding to the temperature change in the heat transfer fluid as it has passed the associated heat transfer block. Also while the valve may be upstream from the thermal transfer block, the quickest response times will be for valves located downstream from the thermal transfer block and upstream from the transports. The closer the valve is to the thermal transfer block, the shorter the response time will be for the valve.

The components in need of thermal management may be any device, circuit, sub-assembly or portion of any of these that would benefit from operating within a specified temperature range. Exemplary components included processing units (e.g. CPUs, and GPUs), memory (e.g. RAM), storage devices (e.g. hard drives), printed circuits boards and cards, power supplies, displays (e.g. LCDs), networking devices (e.g. routers and switches), as well as portions of these components including individual circuits.

Electronic devices are required to operate in extreme environmental conditions. High altitude air temperatures can be as low as −40° C., while desert conditions approach 60° C. The operating temperatures of the components may reach outside of this range. Indeed, most components operate comfortably near the upper end of this range, but operate more efficiently if their temperature is reduced even a few degrees. A temperature management system that is flexible enough to be used across this whole range of temperature is advantageous.

The invention is particularly useful in portable or mobile applications. For example, aerial vehicles place many limitations on the amount of space dedicated to any one component; miniaturization is always desirable. Likewise, aerial vehicles may have severe weight restrictions as well. The space and weight limitations drive the manufacturers to create devices with ever denser electrical circuits to provide functionality to the vehicle. Moreover, whether manned or unmanned, aerial vehicles are high value and expensive to replace, so redundancy of systems in the vehicle is also required to maintain an acceptable level of safety. Through miniaturization, a redundant system can be made that is similar in size to the original, non-redundant system. Contrary to the expected outcome, miniaturization does not increase the complexity of the temperature conditioning system; rather, the temperature conditioning system is simpler than traditional systems, whether or not the temperature conditioning system is redundant.

The system also does not increase the load on the electrical system that the component is a part of. Power is a limited resource, particularly in a mobile platform and so any advantage that is available without the need to draw more power is particularly desirable. The absence of control units also means that there is no additional thermal load on the device through the use of this temperature conditioning system.

The thermo-responsive valve 16 controls the flow rate of the heat transfer fluid in fluid path. In a situation where cooling of a component is needed, as a particular component (e.g. a CPU) heats up due to increased operation, the thermal transfer block associated with that component begins to transfer more thermal energy to the heat transfer fluid flowing through that thermal transfer block and increasing its temperature. This in turn causes the thermo-responsive valve to open wider, allowing more heat transfer fluid to flow in the fluid path, which helps cool that particular component. This type of thermo-responsive valve may be called a cooling valve, and it opens in response to increased heat transfer fluid temperatures and closes in response to decreased heat transfer fluid temperatures.

In an alternate situation where warming of a component is required, the thermo-responsive valve operates in much the same manner; however, the valve will open in response to a decrease in temperature of the heat transfer fluid. As the thermal transfer block associated with the component begins to transfer more thermal energy to the component from the heat transfer fluid, the temperature of the heat transfer fluid will decrease, indicating a need for more thermal energy. This in turn causes the thermo-responsive valve to open wider, allowing more heat transfer fluid to flow in the fluid path, which helps heat that particular component. This type of thermo-responsive valve may be called a warming valve, and it opens in response to decreased heat transfer fluid temperatures and closes in response to increased heat transfer fluid temperatures.

Because the thermo-responsive valve operates as its own temperature sensor, no external or separate sensor is required. Because no external sensor is required, no electronic control unit to operate the transports is required to regulate the fluid flow to a particular thermal transfer block. Without the need of sensors, wiring and electronic control units, the complexity and weight of the overall temperature conditioning system can be reduced.

Furthermore, because each thermo-responsive valve is associated with one thermal transfer block, the plurality of thermo-responsive valves passively directs the flow of heat transfer fluid among the components to the ones that currently require temperature management. In this manner, heat transfer fluid can be directed to only those components that are currently active and/or require thermal energy management. This optimization of heat transfer fluid flow means that smaller, shared transports may be used, as well as smaller amounts of heat transfer fluid compared to an unoptimized system. This furthers the goal of having a temperature conditioning system that is small in size and has a reduced weight without increasing the complexity of the system.

One example of optimization in a cooling situation may be seen in a computer. General purpose computers usually contain a CPU, RAM, a graphic processing unit (GPU), storage and a display. Each of these may have a thermal transfer block associated with it to provide cooling. All of these components require baseline cooling. However, they may be active at different times during the operation of the computer, thus requiring different levels of cooling; i.e., they have differing time-dependent heat generating profiles. With thermo-responsive valves associated with each thermal transfer block, each component will receive higher heat transfer fluid flow rates when that component is active and lower heat transfer fluid flow rates when the component is inactive, thereby allowing sharing of temperature conditioning resources among components having differing time-dependent temperature conditioning needs.

The lack of any external sensor or control unit means that the temperature conditioning system is highly responsive to the temperature conditioning needs of a particular component. The external sensors and control units add a defined amount of time to the feedback loop required to actuate a valve. The thermo-responsive valves respond quicker to changes in temperature because the time required for feedback is eliminated. The quick response time is well suited for temperature conditioning components during burst or peak operations in which the demand for temperature conditioning is immediate, strong and/or short lived.

Any type of thermo-responsive valve may be utilized in the temperature conditioning system. Also called thermostatic valves, thermo-responsive valves typically incorporate at least one material that expands, contracts or changes shape or volume based on changes in the temperature of the heat transfer fluid. Examples of these materials include shape memory alloys and plastics. These materials have a permanent shape and a temporary shape. Counter-intuitively, the permanent shape is the configuration the material takes on when it is heated, while the temporary shape is the configuration the material takes on in cooler conditions. For use in a cooling valve, the permanent shape would be such that the valve would be more open, while the temporary shape would be such that the valve would be more closed. Thus, the warmer the heat transfer fluid, the more open the fluid path would become because of the transition from the temporary shape to the permanent shape. The reverse transition would also take place as the heat transfer fluid cools down. For use in a warming valve, the permanent shape would be such that the valve would be more closed, while the temporary shape would be such that the valve would be more open. Thus, the cooler the heat transfer fluid, the more open the fluid path. As the fluid heats up, representing less thermal energy transfer to the component, the valve transitions from the temporary shape (open) to the permanent shape (closed).

Another embodiment of the thermo-responsive valve incorporates at least two materials that have different coefficients of thermal expansion (CTE). Differential CTEs cause one material to expand faster than the other material, with the result being that the component changes its shape from its starting shape to its ending shape. These materials are typically bonded together such that as one expands, the other does not (or not as much), causing the overall shape of the component to change. An example of this material is a bimetallic component having a layer each of two different metals bonded together. For use in a cooling valve, the starting shape would be such that the valve would be more closed, while the ending shape would be such that the valve would be more open. Thus, the warmer the heat transfer fluid, the more open the fluid path would become because of the transition from the starting shape to the ending shape. The reverse transition would also take place as the heat transfer fluid cools down. Opposite starting and ending shapes would be used in a warming valve; i.e., the warmer the heat transfer fluid, the more closed the fluid path would become because of the transition from the starting shape (open) to the ending shape (closed).

Figure 2A:
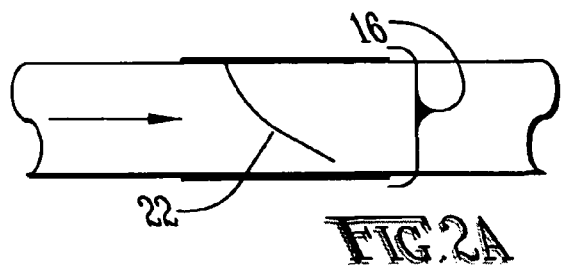
FIG. 2A shows a cross-section of the fluid path in which the passive valve is in its starting position.
Figure 2B:
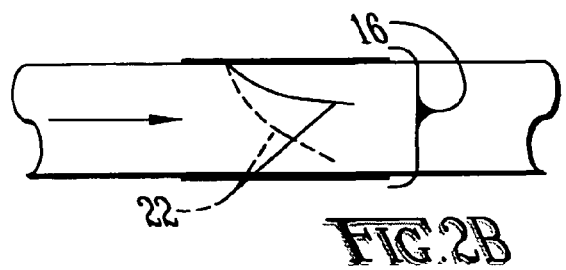
FIG. 2B shows a cross-section of the fluid path in which the passive valve is in its ending position with its original position shown in shadow.

The valve member of the thermo-responsive valve is not required to have any particular starting or ending shape or volume. In one embodiment, valve member is a flap with at least one edge fixed to the wall of the fluid path. The remaining parts of the flap should move within the fluid path to permit more or less heat transfer fluid to flow in the fluid path. The cross section of the flap may be straight or arcuate. For fixed edge embodiments with the valve closed, the edge opposite the fixed edge preferably is spaced apart from the adjacent wall of the fluid circuit. The valve member thus does not entirely block the fluid path in its closed position and allows some fluid flow when closed. It is contemplated that these embodiments may be made out of either a single material or multiple materials. FIG. 2A shows a flap valve member 22 of a cooling valve with an arcuate cross-section in its partially open starting position and FIG. 2B shows the flap valve member 22 in its more open ending position (with the starting position shown in shadow).

In another embodiment of the valve member, the valve member substantially blocks the entire fluid path except for a port through the valve member. By having the heat transfer fluid flow through the port, some fluid flow is achieved when the valve member is in its closed position. The valve member with a port may operate similarly to the flap valve member described above; e.g., it swings to allow more or less fluid flow as the temperature increases, depending on whether the valve member is used in a cooling valve or in a warming valve. In the alternative, the valve member with the port may operate such that the port increases or decreases in diameter as the temperature of the heat transfer fluid increases (such as through a change in volume of the valve member material). In this way, for a cooling valve, a higher fluid flow rate is achieved as the temperature increases. It is contemplated that these embodiments may be made out of either a single material or multiple materials.

FIG. 1 shows the valves 16 as identical. While this may be preferred in some applications, it should be understood that the valves may be of differing types (e.g. bimetallic compared to shape memory). Moreover, the valves may have differing physical characteristics, such as minimum and maximum fluid flow rates through the valve. Likewise, the valve may also differ in the responsiveness of the valve member to temperature and temperature changes. Further, it is contemplated that both cooling and warming valves may be used in the same system with the same heat transfer fluid as different components may require contradictory temperature management.

The thermo-responsive valves may operate over a narrow or broad range of temperatures. For example, one valve member may operate over a temperature range of only a few degrees centigrade, while another valve member may operate over a temperature range of 10, 20, 30 or more degrees centigrade. The base temperature for the thermo-responsive value is largely dictated by the ambient conditions for the components the system is temperature conditioning. For example, the valve associated with a CPU in a home computer may operate to maintain the heat transfer fluid (and thus the CPU) at a temperature under 60° C.; that is, cool the CPU. On the other hand, aviation electronics may be exposed to ambient air temperatures of under −40° C. and thus a valve associated with this component will actuate at temperatures above to help warm the component.

In one embodiment, a plurality of valves is connected to a unitary base. The unitary base embodiment increases the density and lowers the weight, size and complexity of the temperature conditioning system providing a location to collect several thermo-responsive valves. The unitary base also provides opportunities for economies of scales in the production of the thermo-responsive valves. For example, two, three, four, five or more valves could be machined or constructed on to a unitary base to reduce the number of components needed to construct the temperature conditioning system. Instead of a separate valve for each thermal transfer block, a unitary base could provide valves for a number of thermal transfer blocks in one location. As seen in FIG. 3, a unitary base 24 may contain any number of thermo-responsive valves 16 located in portions of the fluid circuit 14.

The thermal transfer blocks 10 only require an inlet and an outlet, both connected to the fluid path and allowing the heat transfer fluid to flow through one or more channels within the thermal transfer block. The primary purpose of the thermal transfer block is to transfer thermal energy from the component to the heat transfer fluid or vice versa. The thermal transfer block may also serve as a heat sink that in turn radiates thermal energy from the heat transfer fluid to the surroundings; however, this is not required. Indeed, the thermal transfer block may be covered in insulation to increase the effectiveness of the thermal energy transfer between the component and the heat transfer fluid. The thermal transfer blocks may also include thermoelectric functionality, converting thermal energy into electricity.

For electrically conductive liquid heat transfer fluids, the thermal transfer block also serves the purpose of separating the component from the heat transfer fluid. For non-conductive liquid heat transfer fluids, the thermal transfer block merely needs to contain the liquid in proximity to the component to allow thermal energy to be transferred to or from the liquid. The thermal transfer blocks would typically be made of metals such as aluminum, copper or other materials such as kovar, aluminum nitride, aluminum graphite, aluminum silicon, aluminum silicon carbide, copper graphite, aluminum graphite, diamond, etc. While copper is a better thermal conductor, aluminum is significantly less dense for a similar sized amount, thus reducing the overall weight of the system.

The one or more transports 12 of the temperature conditioning system are generally required to only be on or off as the thermo-responsive valves regulate the fluid flow rate. Exemplary transports include pumps for liquids and fans for gases. No external electronic control unit is required to coordinate the transport speed and valve position. The one or more transports have sufficient power to move the heat transfer fluid through the fluid path in order to meet the estimated peak demand of the thermal energy transfer by the fluid to protect the components thermally regulated by the system. By utilizing several transports at one time, smaller transports may be used, cutting size and weight of the transports, but also providing redundancy in case of the failure of one of the transports. Transports that provide a constant flow rate of fluid at a given rotational speed are preferred because of the simplicity of design and construction. However, transports that provide increased flow rates with increased temperature of the heat transfer fluid are also contemplated. For example, the pumps of U.S. Patent Application 2003/0099539 may be useful as a transport in the temperature conditioning system.

The fluid path 14 may be created by any acceptable size, shape or length of tubing that connects the various components of the system with relatively fluid tight seals. The tubing may be thermally conducting or insulating. While typically round, the cross-section of the tubing does not greatly matter. The area of the cross-section of the tubing should be matched to thermal energy transfer needs of the temperature conditioning system. Too small of an area will mean insufficient temperature conditioning of the components, while too large of an area will mean power wasted on providing too much fluid flow. However, the tubing of the fluid path need not be of a single cross-sectional area, with high demand components having larger cross-sectional tubing and vice versa. The tubing size and weight should be minimized where possible to facilitate smaller temperature conditioning systems. While closed-loop systems are preferred, open-loop systems are also contemplated, such as where ambient air or water is used as the heat transfer fluid. In open-loop embodiments, the fluid circuit does not necessarily connect the thermal transfer block back to the transport.

The heat transfer fluid provides a medium to conduct thermal energy through the fluid path. The fluid is selected from any material that flows at the then present temperature conditions present in the fluid path. While gases and liquids are preferred, variations are contemplated as well, such as colloids, solutions, sols, particulates suspended in a solvent. Bi-phasic materials may also be used to take advantage of energy absorbed by the material during a phase transition, such as from solid to liquid. Combinations of these materials may also be used. Exemplary heat transfer fluids include air, water, poly-alpha-olefins liquids (PAOs), polypropylene glycol and ethylene glycol. Selection of the heat transfer fluid will depend on the temperature range that is to be maintained by the system. Water may be suitable for room temperature situations, whereas ethylene glycol may be suitable for sub-zero conditions. Also, the heat transfer fluid may be selected based on the desired temperature that the component is to operate at. For example, cryogenic fluids may be used to cool components to very low temperatures. Non-conducting fluids are preferred because of the proximity of the fluid to the components. Without the need to worry about shorting out components, the design and build standards of the system can be slightly relaxed, meaning reduced cost and lower complexity of the system.

Liquid heat transfer fluids are preferred as this permits components to be more densely packed together while permitting a reduction in the volume of the device because an airflow path is not required. Moreover, liquids tend to have higher heat capacities compared to air and other gases.

The optional heat sinks 20 may serve both to radiate thermal energy from the heat transfer fluid and to convert thermal energy to electricity. Radiator heat sinks typically include a high surface area portion (e.g. a plurality of fins) that effectively transmits thermal energy to the surroundings. Thermoelectric devices may be used in place of, or in combination with, radiator heat sinks to create electricity from the thermal energy contained in the heat transfer fluid. Heat sinks will find the most use in cooling systems but will also find use in warming systems and combination systems that have both cooling and warming valves. In addition to heat sinks, the temperature conditioning system may also include a thermal input device where thermal energy is transferred into the heat transfer fluid. This is especially useful for warming systems which require a source of warmed heat transfer fluid. The thermal input devices may include, among other things, thermoelectric devices, resistance heaters or heat sinks.

As used herein, heat generally means an increase in thermal energy or an increase in thermal energy transfer while cooling means a reduction in thermal energy or a reduction in thermal energy transfer. Electrical circuit may mean discrete components having a single function or a combination of components that accomplish either a single or multiple functions. A combination of electrical circuits is also considered an electrical circuit. It will be further appreciated that functions or structures of a plurality of components or steps may be combined into a single component or step, or the functions or structures of one-step or component may be split among plural steps or components. The present invention contemplates all of these combinations. Unless stated otherwise, dimensions and geometries of the various structures depicted herein are not intended to be restrictive of the invention, and other dimensions or geometries are possible. Plural structural components or steps can be provided by a single integrated structure or step. Alternatively, a single integrated structure or step might be divided into separate plural components or steps. In addition, while a feature of the present invention may have been described in the context of only one of the illustrated embodiments, such feature may be combined with one or more other features of other embodiments, for any given application. It will also be appreciated from the above that the fabrication of the unique structures herein and the operation thereof also constitute methods in accordance with the present invention. The present invention also encompasses intermediate and end products resulting from the practice of the methods herein. The use of "comprising" or "including" also contemplates embodiments that "consist essentially of" or "consist of" the recited feature.

The explanations and illustrations presented herein are intended to acquaint others skilled in the art with the invention, its principles, and its practical application. Those skilled in the art may adapt and apply the invention in its numerous forms, as may be best suited to the requirements of a particular use. Accordingly, the specific embodiments of the present invention as set forth are not intended as being exhaustive or limiting of the invention. The scope of the invention should, therefore, be determined not with reference to the above description, but should instead be determined with reference to the appended claims, along with the full scope of equivalents to which such claims are entitled. The disclosures of all articles and references, including patent applications and publications, are incorporated by reference for all purposes.

What is claimed is:

1. A temperature conditioning system comprising:
 a plurality of thermal transfer blocks, each associated with one of a plurality of electronic components, on an aerial vehicle, said electronic components requiring thermal management, wherein each of the plurality of components being associated with a differing time dependent thermal management profile;
 one or more fluid transports;
 a fluid path connecting the one or more transports to the thermal transfer blocks;
 a heat transfer fluid contained within the fluid path; and
 for each thermal transfer block, at least one non-electrical thermo-responsive warming valve, which opens in response to decreased heat transfer fluid temperatures and closes in response to increased heat transfer fluid temperatures, located downstream from the thermal transfer block.

2. The system of claim 1 wherein the thermo-responsive warming valve is a passive thermo-responsive warming valve that does not require energy other than thermal energy to move from a starting position to an ending position and the thermo-responsive warming valve is free of any exterior control lines.

3. The system of claim 2 wherein the warming valve includes a valve member that changes its shape in response to changes in the temperature of the heat transfer fluid and the warming valve is free of any connection with any external sensors, power supplies, and electronic controls.

4. The system of claim 3 wherein the valve member is in contact with the heat transfer fluid.

5. The system of claim 4 wherein the fluid path connects the plurality of warming valves to the one or more transports to form a closed loop fluid circuit.

6. The system of claim 4 wherein the heat transfer fluid is a liquid.

7. The system of claim 6 wherein a plurality of individual warming valves are located on a unitary base.

8. The system of claim 6 wherein the starting position of the warming valve is at least partially open.

9. The system of claim 8 further comprising a plurality of thermo-responsive valves that are a combination of cooling valves and warming valves.

10. The system of claim 8 wherein the valve member is a flap valve member.

11. The system of claim 1 is a heated fluid.

12. A temperature conditioning system comprising:
a plurality of thermal transfer blocks, each associated with an electronic component, on an aerial vehicle, the electronic component requiring thermal management having differing time dependent thermal management characteristics;
one or more liquid pumps;
a fluid path connecting the one or more pumps to the thermal transfer blocks and connecting the thermal transfer blocks back to the one or more pumps;
a liquid heat transfer fluid contained within the fluid path;
for each thermal transfer block, at least one non-electrical thermo-responsive warming valve, which opens in response to decreased heat transfer fluid temperatures and closes in response to increased heat transfer fluid temperatures, located in the fluid path between the thermal transfer block and the one or more pumps; and
one or more heat sinks located in the fluid path between the thermo-responsive warming valves and the one or more pumps.

13. The system of claim 12 wherein the at least one warming valve additionally comprises one or more cooling valves.

14. A temperature conditioning system comprising:
a plurality of thermal transfer blocks, each associated with one of a plurality of electronic components, on an aerial vehicle, the electronic components requiring thermal management, wherein each of the plurality of components being associated with a differing time dependent thermal management profile and each having a component temperature;
one or more fluid transports;
a fluid path connecting the one or more transports to the thermal transfer blocks;
a heat transfer fluid contained within the fluid path and having a fluid temperature; and
for each thermal transfer block, at least one non-electrical thermo-responsive warming valve which opens in response to decreased heat transfer fluid temperatures and closes in response to increased heat transfer fluid temperatures, located downstream from the thermal transfer block, wherein said fluid temperature exceeds said component temperature.

15. The system of claim 14 wherein the thermo-responsive valve is a passive thermo-responsive warming valve that does not require energy other than thermal energy to move from a starting position to an ending position and the thermo-responsive valve is free of any exterior control lines.

16. The system of claim 15 wherein the valve includes a valve member that changes its shape in response to changes in the temperature of the heat transfer fluid and the valve is free of any connection with any external sensors, power supplies, and electronic controls.

17. The system of claim 16 wherein the valve member is in contact with the heat transfer fluid.

18. The system of claim 17 wherein the heat transfer fluid is a liquid.

* * * * *